United States Patent [19]

Klein

[11] 3,777,276

[45] Dec. 4, 1973

[54] PHASE LOCK LOOP WITH AUTOMATIC STEP BY STEP SEARCH SWEEP FOLLOWED BY LINEAR SEARCH SWEEP

[75] Inventor: Ira Klein, Brooklyn, N.Y.

[73] Assignee: The United States of America as represented by the Secretary of the Navy, Washington, D.C.

[22] Filed: Jan. 24, 1973

[21] Appl. No.: 326,225

[52] U.S. Cl. .......................... 331/4, 331/1 A, 331/10, 331/22, 331/25

[51] Int. Cl. .............................................. H03b 3/04

[58] Field of Search..................... 331/4.1 A, 22, 25, 331/10, 11

[56] References Cited

UNITED STATES PATENTS

| | | | |
|---|---|---|---|
| 3,212,023 | 10/1965 | Broadhead, Jr. | 331/11 |
| 3,401,353 | 9/1968 | Hughes | 331/25 X |
| 3,411,103 | 11/1968 | Deman et al. | 331/8 X |
| 3,636,467 | 1/1972 | Babany et al. | 331/4 |

*Primary Examiner*—Roy Lake
*Assistant Examiner*—Siegfried H. Grimm
*Attorney*—Richard S. Sciascia et al.

[57] ABSTRACT

Disclosed is a phase-locking oscillator loop circuit in conjunction with automatic circuitry for searching for and forcing a phase locked condition with respect to a reference frequency, in which condition the oscillator of the loop operates at a frequency which is a function of first and second input frequencies. The automatic circuitry is characterized by means for step by step searching from a first coarse frequency approximation, with transition to a linear sweep until the lock frequency is achieved. The step by step search automatically reiterates if the desired frequency is passed.

8 Claims, 3 Drawing Figures

PHASE LOCK LOOP WITH AUTOMATIC STEP BY STEP SEARCH SWEEP FOLLOWED BY LINEAR SEARCH SWEEP

STATEMENT OF GOVERNMENT INTEREST

The invention described herein may be manufactured and used by or for the Government of the United States of America for Governmental purposes without the payment of any royalties thereon or therefor.

FIELD OF THE INVENTION

This invention relates to phase locking oscillator loop systems and more particularly to such a loop system incorporating improved circuitry for automatically forcing a voltage controlled oscillator loop into its capture range. Phase locking loops employing voltage controlled oscillators are utilized for various purposes including frequency synthesization, frequency tracking in radio reception, and the like. The characteristics of some phase-locking loops are such that the capture range of the loop (maximum initial frequency error in the loop that will still allow the loop to phase lock) is relatively small (say several hundred KHz maximum in a loop intended to operate in the 1 to 2 GHz range), while the lock range of such a loop (indicated by the maximum frequency excursion any reference input to the loop may take, after the loop is initially locked, without breaking the lock) is relatively large (typically ± 30 MHz in the mentioned example). Such characteristics demand phase lock seeking circuitry which is capable of rapid and positive action when driving the loop oscillator toward a desired frequency from a first or coarse approximation of the desired frequency, and yet a smooth and stable final approach to the capture range.

DISCUSSION OF THE PRIOR ART

U. S. Pat. Nos. 3,212,023 of S. L. Broadhead, Jr., 3,401,353 of R. J. Hughes, and 3,411,103 of P. Deman et al., are illustrative of phase lock oscillator loop systems wherein step by step variations of oscillator output are utilized to bring the loop into capture range. Each of these systems presupposes that the system loop is capable of locking when the oscillator is operating anywhere within the range of the step which includes the desired frequency. To achieve this, both the Hughes and the Deman et al patents include complex digital means for completing the capture sequence, while the Broadhead patent relies on the action of filters in high and low frequency loops to effect and maintain capture within a step.

SUMMARY OF THE INVENTION

The present invention utilizes step by step variations as a coarse procedure to bring the voltage controlled oscillator of a phase locking loop from a first, coarse approximation of a desired frequency to a better approximation within a predetermined differential with respect to the actual desired frequency, and then automatically institutes a substantially linear variation of the loop frequency until actual lock is achieved.

Accordingly, it is a principal object of this invention to provide improved phase locking circuitry for bringing a controllably variable oscillator loop into phase lock with a reference frequency from a stable and dependable source, such as a crystal controlled oscillator.

Another object of this invention is the provision of circuit means for effecting phase lock by first sweeping the controllable oscillator toward the desired frequency by steps and then by a linear sweep until lock is achieved, the circuit means comprising simple and reliable logic means for automatically effecting the transition from step sweep to linear sweep and from linear sweep to stable operation.

Still another object of the invention is the provision of circuitry of the foregoing character which will automatically function to return and reiterate the step by step search if, by some accident, phase lock is not achieved.

The invention may be further said to reside in certain novel constructions, arrangements of parts, and combinations of elements by which many of the foregoing objects and advantages are achieved, as well as others which will become apparent from the following description of a presently preferred embodiment when read in conjunction with the accompanying sheet of drawing.

DESCRIPTION OF THE PREFERRED EMBODIMENT

Figure 1:
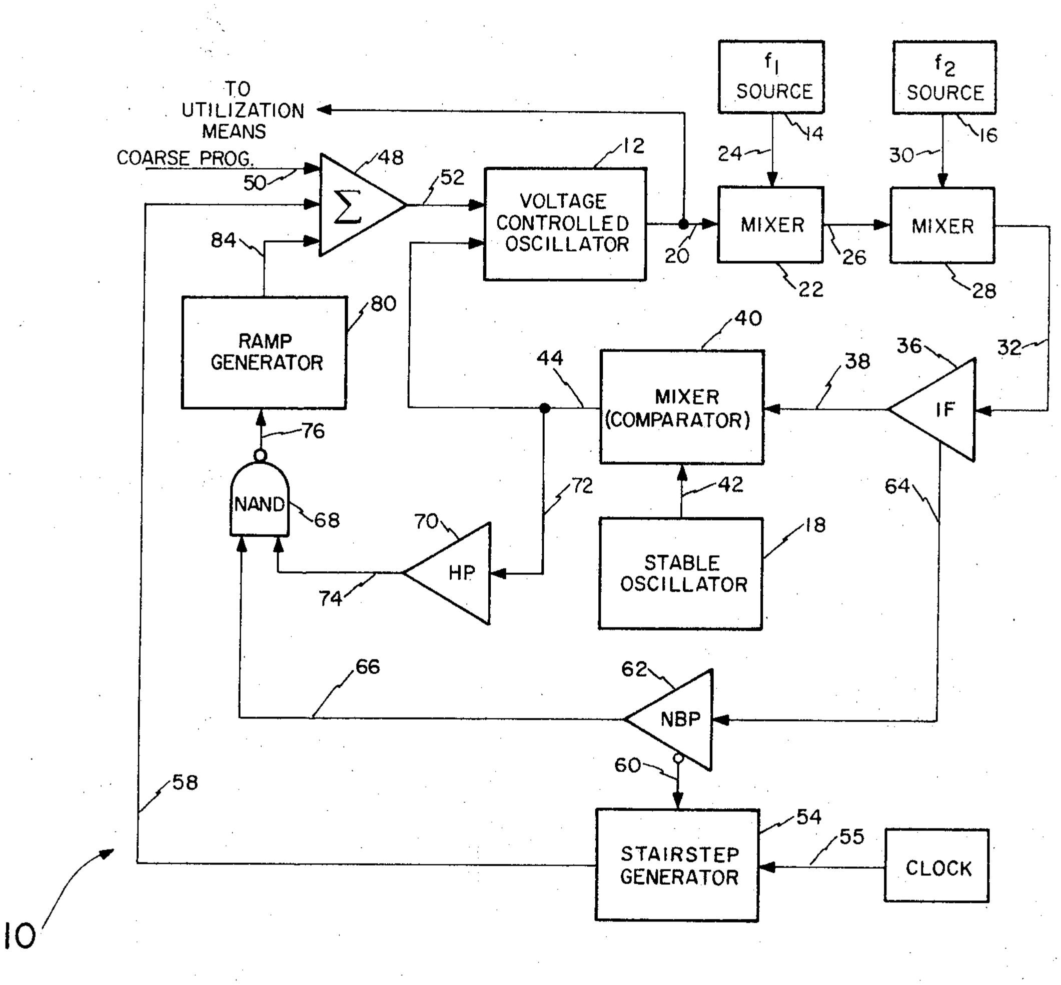
FIG. 1 is a diagrammatic illustration, in block form, of a phase locking oscillator loop system embodying the present invention.
Figure 2:
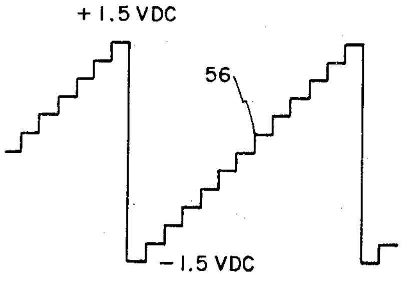
FIG. 2 is a graphical view illustrating a staircase voltage waveform for effecting step by step variations of oscillator frequency.
Figure 3:
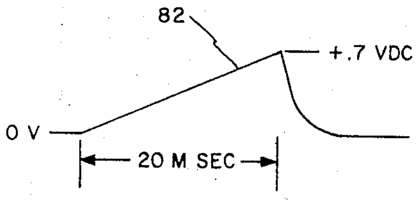
FIG. 3 is a graphical view illustrating a linear voltage ramp for effecting final sweep to achieve phase lock.

In the form of the invention illustrated in FIG. 1 and described hereinafter, there is provided an automatic phase locking loop system, indicated by the general reference numeral 10, which comprises a voltage controlled oscillator 12 that is desired to be operated at a frequency $f_{lock}$ which is a function of first and second input frequencies $f_1$ and $f_2$ derived from first and second frequency sources 14 and 16. Moreover, it is desired that voltage controlled oscillator 12 be operated in phase locked condition relative to a reference frequency $f_3$ from a third frequency source 18, which is desirably a stable oscillator and in this example will be considered to provide a reference frequency $f_3$ of 60 MHz. The particular utilization of the output of voltage controlled oscillator 12 and the particular nature of sources 14 and 16 are not necessary to an understanding of the invention. However, as an illustrative example it may be considered that the system 10 is to form part of a frequency synthesizer, which in turn forms part of a larger, sophisticated system for testing complex electronic apparatus. Thus, sources 14 and 16 may be regarded as providing input frequencies $f_1$ and $f_2$ which are control frequencies for the desired output frequency $f_{lock}$ which, in this example, may be represented by the following equation:

$$f_{lock} = 60 \text{ MHz} + f_1 - f_2 \quad (1)$$

Now, in the example of FIG. 1, the voltage controlled oscillator 12 is capable of operation say in the range of 1.0 to 2.0 GHz. The output of the oscillator 12 is connected as shown by line 20 as one input of a first frequency mixer 22. The output $f_1$ of the first input frequency source 14 is connected as shown by line 24 as a second input to mixer 22.

As is well understood by those skilled in the art to which the invention pertains, the output of a mixer includes both the sum and the difference frequencies of the inputs. In this example the output of the mixer 22 which is used is the difference frequency signal, and this difference frequency signal output is connected as shown by line 26 as one input to a second mixer 28. The output $f_2$ of the second input frequency source 16 is connected as shown by line 30 as the second input to mixer 28. The intermediate frequency (IF) output signal $f_{IF}$ taken from the mixer 28, and represented by line 32, is the sum of the frequency $f_2$ and the frequency of the output signal of mixer 22. In accordance with Equation (1), if oscillator 12 is operating at the desired frequency $f_{lock}$, then $f_{IF}$ will equal 60 MHz. Of course, if the system is out of lock, $f_{IF}$ will differ from 60 MHz and it is then the task of the following described circuitry to seek and force operation of oscillator 12 at a frequency where $f_{IF}$ does, in fact, equal 60 MHz.

The output of mixer 28 is fed to an IF amplifier 36 which is preferably characterized as having a limited band of frequency response. In this example, that limited band is centered substantially at 60 MHz, which has been mentioned as the intermediate frequency selected to be used as the reference frequency $f_3$ supplied by reference frequency source 18.

The output of IF amplifier 36, which is frequency $f_{IF}$ and may vary from reference frequency $f_3$, is connected as shown by line 38 as one input to a third mixer 40. The other input to mixer 40 is the frequency $f_3$ derived from the source 18, which may conveniently be a precision, crystal controlled oscillator, as shown by line 42. Mixer 40 serves as a phase comparator, in that when frequencies $f_{IF}$ and $f_3$ are equal but not in phase, the output represented by line 44 from mixer 40 will be a D.C. voltage signal proportional to phase difference. When there exists a frequency difference, there will exist on line 44 a frequency proportional to that difference at a fixed voltage. The loop seeks proper frequency and phase of the output of voltage controlled oscillator 12 to maintain proper phase relationship at mixer 40 which, in turn, holds oscillator 12 at the proper frequency.

Thus far, there has been described a loop which maintain voltage controlled oscillator 12 in phase lock once capture has been achieved. However, the characteristics of the loop are such that the capture range of the loop (maximum initial frequency error in the loop that will still allow the loop to phase lock) is relatively small (several hundred KHz maximum), while the lock range of the loop (the maximum frequency excursion any reference input to the loop may take, after the loop is locked, without breaking the lock) is relatively large, typically of the order of $\pm$ 30 MHz.

Accordingly, the invention provides means for bringing the voltage controlled oscillator from an initial, non-capturable rough approximation of the desired frequency $f_{lock}$ to a frequency within the capture range of the loop which in this example shall be considered to begin at something slightly over 100 KHz below $f_{lock}$. Thus, a summing amplifier 48 is connected to receive a coarse programming d.c. voltage input represented by line 50, as well as other programming d.c. voltages, later discussed more fully. The summing amplifier 48 provides its output, which is the algebraic sum of its various inputs, via line 52 to the voltage controlled oscillator 12. The mentioned other programming voltages serve to drive the voltage controlled oscillator into the capture range. To this end, a reiterative staircase generator 54 receives a clock input signal via line 55 from a suitable source. The clock signal in this example has a frequency of 10 KHz, and operates to provide a staircase voltage waveform 56 as an output on line 58 to summing amplifier 48. Generator 54 is controllable between on and off conditions of operation by a disabling signal represented by line 60 from a staircase disabling signal source in the form of a narrow passband amplifier 62. When generator 54 is operating, the staircase waveform 56 is characterized as a voltage which increases, by increments or steps occurring at the clock input signal frequency, from a predetermined minimum voltage level such as a negative 1.5 volts d.c. to a maximum of positive 1.5 volts d.c., and then repeats. This signal 56 is added by summing amplifier 48 to the control voltage on line 52 to oscillator 12 for the purpose of stepping the operational frequency of that oscillator toward the capture range.

The narrow passband amplifier 62 which serves to provide logic conditions as its outputs, is connected as shown by line 64 to receive a portion of the output from IF amplifier 36. Amplifier 62 provides as one output on line 66 a first logic level condition, or logic 0, when the input to IF amplifier 36 is less than 55 MHz or greater than 63 MHz. A second logic level condition, or logic 1, is provided on line 66 when the input to amplifier 36 is greater than 55 MHz and less than 63 MHz. Amplifier 62 acts as an inverter with regard to its output on line 60 to the staircase generator 54, in that the logic levels on line 60 are the reverse of those on line 66. Thus, a logic 1 is supplied to enable the staircase generator whenever the input to IF amplifier 36 is less than 55 MHz or more than 63 MHz, and a logic 0 is supplied to disable that generator whenever the input to the amplifier 36 is between those frequencies.

The logic level output on line 66 is applied as a first input to coincidence gate means which in this example is a NAND gate 68. A 100 KHz high passband amplifier 70 is connected as shown by line 72 to be responsive to the voltage output of the mixer 40. Amplifier 70 provides on line 74 a logic 0 whenever the input thereto is less than 100 KHz, i.e., when the output of amplifier 36 is between 59.9 MHz and 60.1 MHz, and provides a logic 1 whenever the output of amplifier 36 is not between 59.9 MHz and 60.1 MHz. The logic 1 is applied as the second input to gate 68.

Gate 68 provides a predetermined logic level on line 76 whenever there is a coincidence of logic 1 outputs of amplifiers 62 and 70, or, in other words, whenever the IF output frequency of amplifier 36 is greater than 55 MHz but less than 59.9 MHz. That predetermined logic level output on line 76 serves to activate an incremental sweep generator 80, which is conveniently in the form of a conventional linear voltage ramp generator that will provide a voltage ramp 82 via line 84 as an input to summing amplifier 48.

MODE OF OPERATION

Consider now that it is desired that the voltage controlled oscillator 12 be operated at a predetermined frequency $f_{lock} = 60\ \text{MHz} + f_1 - f_2$. A coarse program voltage is applied via line 50 to summing amplifier 48 which provides an output via line 52 to oscillator 12 which will cause it to operate at some approximately known (± 15 MHz) initial frequency which is substantially below (more than 5 MHz) the actual desired lock frequency. The output of the series of mixers 22 and 28 wil therefore be below the 55 MHz to 63 MHz passband of amplifier 36, and staircase generator 54 will be enabled to begin generation of a series of voltage steps which produce an increasing programming voltage level on line 58.

The voltage controlled oscillator will, accordingly, increase its frequency of operation by corresponding steps until the IF frequency from the series of mixers 22 and 28 rises to 55 MHz, at which time the amplifier 62 sends a staircase disable signal to halt further increases in the voltage output of staircase generator 54, but to hold the voltage so far achieved. At the same time, a logic 1 is sent via line 66 to the gate 68.

Since the frequency output of the voltage controlled oscillator 12 is then such that the output of mixer 40 will be different from 60 MHz reference source 64 by more than 100 KHz, actually by about 500 KHz, gate 68 will also be receiving a logic 1 via line 74 from amplifier 70. Therefore, at the time staircase generator 54 became disabled in this run, gate 68 causes the incremental sweep generator 80 to begin its voltage ramp output. That output will cause the voltage controlled oscillator to sweep upward in frequency until its output frequency is such that the IF frequency output of the series of mixers 22, 28 differs from the crystal reference frequency from source 64 by 100 KHz or less. At that time, high pass amplifier 70 terminates the logic 1 output to the sweep generator 80.

It will be remembered, however, that the capture range of the oscillator loop in this example begins at something just over 100 KHz. Accordingly, when oscillator 12 is driven by the sweep generator to within 100 KHz of the IF frequency (and also of the desired lock frequency) the oscillator loop will work to achieve and maintain lock.

It is important to note here that although the voltage ramp 82 output of the sweep generator is terminated and decays to zero potential, the presence of a positive d.c. voltage on line 44 from phase comparing mixer 40 is applied to voltage controlled oscillator 12. This compensates for the decaying voltage from sweep generator 80 and assures that the loop will not immediately drop out of lock and, in fact, will seek to produce the actual desired frequency.

If, by some accident stairstep generator 54 is not disabled until the output frequency of oscillator 12 is higher than the desired frequency (i.e., if the IF output of mixer 28 is greater than 60 MHz), the incremental sweep would once again be triggered and would sweep the voltage controlled oscillator out of the upper limit of the stairstep search disable passband (63 MHz). At this point, stairstep generator 54 would start running again and would program the voltage controlled oscillator through another complete cycle, disabling again only when the search disable passband is approached from below its lower limit (55 MHz).

Obviously, other embodiments and modifications of the subject invention will readily come to the mind of one skilled in the art having the benefit of the teachings presented in the foregoing description and the drawings. It is, therefore, to be understood that this invention is not to be limited thereto and that said modifications and embodiments are intended to be included within the scope of the appended claims.

What is claimed is:

1. An oscillator system having the capability to automatically seek phase lock at a desired frequency which is a function of a plurality of input frequencies, said system comprising:

an oscillator loop having a characteristic lock capture range and including voltage controlled oscillator means, mixer means for deriving an intermediate frequency signal from a combination of input frequency signals and the output frequency signal of said voltage controlled oscillator means, a source of a reference frequency signal, and comparator means for deriving from a combination of said reference frequency signal and said intermediate frequency signal a feedback voltage signal as an input to said voltage controlled oscillator, which feedback voltage signal causes said loop to tend to maintain lock; and automatic search means, connected to said loop, for initiating step-by-step frequency changes of said voltage controlled oscillator means as long as said intermediate frequency signal falls outside a predetermined frequency range which includes said reference signal, for terminating said step-by-step frequency changes and initiating a linear frequency change of said voltage controlled oscillator when said intermediate frequency signal falls both within said first predetermined frequency range and outside a second predetermined frequency range with respect to said frequency signal.

2. An oscillator system as defined in claim 1 and wherein said mixer means comprises:

a first mixer connected to combine the output frequency signal of said voltage controlled oscillator and a first of said input frequency signals; and a second mixer connected to combine the output signal of said first mixer and a second of said input frequency signals to derive said intermediate frequency signal.

3. An oscillator system as defined in claim 2 and wherein said loop further comprises:

band pass limiting amplifier means, connected between said mixer means and said comparator means, for amplifying said intermediate frequency signal substantially only when it falls in said first predetermined frequency range.

4. An oscillator system as defined in claim 3, and wherein said automatic search means comprises:

stairstep generator means for generating a stairstep voltage signal;

ramp generator means for generating a linear ramp voltage signal; and logic means, connected to be responsive to outputs of said limiting amplifier means and of said comparator means, for rendering said stairstep generator operative only when said intermediate frequency signal falls outside said first predetermined frequency range, and for rendering said ramp generator operative only when there is coincidence of said intermediate frequency signal falling within said first predetermined range and falling outside said second predetermined frequency range.

5. An oscillator system as defined in claim 4, and wherein said automatic search means further comprises:

summing amplifier means responsive to said linear ramp voltage signal, to said stairstep voltage signal, and to a coarse programming voltage signal to provide a frequency determining input voltage to said voltage controlled oscillator means.

6. An oscillator system as defined in claim 5 and wherein said logic means comprises:

means connected to the output of said limiting amplifier means, for providing first and second logic output conditions corresponding respectively to whether said intermediate frequency signal is without or within said first predetermined frequency range;

means connected to the output of said comparator means, for providing third and fourth logic conditions corresponding respectively to whether or not said feedback voltage signal exceeds a predetermined condition indicative of said intermediate frequency signal being in said second predetermined frequency range;

said stairstep generator means being responsive to said first logic condition to initiate generation of said stairstep voltage signal, and responsive to said second logic condition to terminate said stairstep voltage signal.

7. An oscillator system as defined in claim 6, and wherein:

said stairstep generator is characterized as a reiterative generator whereby, as long as said stairstep generator is enabled, said stairstep voltage signal progresses from a predetermined starting voltage level by steps to a predetermined final voltage level and then returns directly to said starting voltage level from which it again progresses by steps toward said final voltage level.

8. An automatically searching phase locking oscillator loop circuit comprising:

voltage controlled oscillator means for providing an oscillator output signal at a frequency which varies with changes in a direct current voltage control signal input thereto;

summing means, connected to said voltage controlled oscillator means, for providing said control signal in response to one or more component voltage inputs;

input frequency source means for providing first and second input frequency signals;

first mixer means, connected to receive said first input frequency signal and said oscillator output signal, for providing a combined frequency signal;

second mixer means, connected to receive said second input frequency signal and said combined frequency signal, for providing an intermediate frequency signal;

intermediate frequency amplifier means, connected to receive said intermediate frequency signal, for amplifying such portion thereof as falls within a first predetermined frequency range;

a source of a reference frequency signal;

comparator means, connected to respond to the output of said narrow intermediate frequency amplifier and to said reference frequency signal, for providing an output which varies as said intermediate frequency signal differs from said reference frequency signal;

high pass amplifier means, connected to receive said output of said comparator means, for providing first and second logic signal conditions, respectively, as said intermediate frequency signal differs from said reference frequency signal by an amount which falls without or within a second predetermined frequency range;

narrow passband amplifier means, connected to receive an output of said intermediate frequency amplifier, to provide third and fourth logic conditions, respectively, as said intermediate frequency falls within or without said first predetermined frequency range;

reiterative stairstep generator means, connected to be responsive to said third and fourth logic conditions, for providing a stairstep voltage signal output when said fourth logic condition prevails;

coincidence gate means, connected to be responsive to coincidence of said first and third logic conditions, for providing a fifth logic condition upon said coincidence;

ramp generator means, connected to be responsive to said fifth logic condition, for generating a linear voltage ramp signal;

said summing means, connected to receive as inputs a coarse programming voltage signal, said stairstep voltage signal, and said linear voltage ramp signal, for providing a combined control voltage signal to said voltage controlled oscillator means; and said voltage controlled oscillator means being responsive to said combined control voltage and to the output of said comparator to provide a desired output frequency which is a function of said first and second input frequencies.

* * * * *